US 012235577B2

United States Patent
Hunt et al.

(10) Patent No.: US 12,235,577 B2
(45) Date of Patent: Feb. 25, 2025

(54) ARRAYED STRUCTURED REPLICATION ARTICLES AND METHODS

(71) Applicant: 3M INNOVATIVE PROPERTIES COMPANY, St. Paul, MN (US)

(72) Inventors: Lucas J. Hunt, Nowthen, MN (US); Ashley R. Sonnier, Minneapolis, MN (US); James Zhu, Woodbury, MN (US); Edwin L. Kusilek, Baldwin, WI (US); Paul B. Armstrong, St. Paul, MN (US); William B. Kolb, Stillwater, MN (US); Caleb T. Nelson, McKinney, TX (US); Jeffrey L. Solomon, Centerville, MN (US); James M. Nelson, Lino Lakes, MN (US); Samuel R. Hei, White Bear Township, MN (US); David J. Tarnowski, Mahtomedi, MN (US); Henrik B. van Lengerich, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/257,241

(22) PCT Filed: Dec. 8, 2021

(86) PCT No.: PCT/IB2021/061453
§ 371 (c)(1),
(2) Date: Jun. 13, 2023

(87) PCT Pub. No.: WO2022/136992
PCT Pub. Date: Jun. 30, 2022

(65) Prior Publication Data
US 2024/0045324 A1    Feb. 8, 2024

Related U.S. Application Data

(60) Provisional application No. 63/199,344, filed on Dec. 21, 2020.

(51) Int. Cl.
*G03F 7/00* (2006.01)
*B29C 59/00* (2006.01)
*H01L 21/027* (2006.01)

(52) U.S. Cl.
CPC .......... *G03F 7/0002* (2013.01); *B29C 59/002* (2013.01); *H01L 21/027* (2013.01)

(58) Field of Classification Search
CPC . G03F 7/0002; G03F 7/70975; B29C 59/002; B29C 59/02; H01L 21/027; H01L 21/66739; H01L 21/67772
See application file for complete search history.

(56) References Cited

U.S. PATENT DOCUMENTS

| 5,772,905 A | 6/1998 | Chou |
| 6,334,960 B1 | 1/2002 | Willson et al. |

(Continued)

FOREIGN PATENT DOCUMENTS

| WO | 2014105633 A1 | 7/2014 |
| WO | 2020095258 A1 | 5/2020 |

OTHER PUBLICATIONS

International Search Report for PCT International Application No. PCT/IB2021/061453, mailed on Mar. 14, 2022, 4 pages.

*Primary Examiner* — Jacob T Minskey
*Assistant Examiner* — Caroline Beha
(74) *Attorney, Agent, or Firm* — Thomas M. Spielbauer (57) ABSTRACT

Methods of forming an array of patterns on a substrate are provided. An array of protective tiles formed from a protectant resin is provided to cover an array of sub-regions on the substrate. An array of patterns is formed on the substrate by sequentially repeating steps (i) and (ii) for each sub-region: (i) removing the protective tile from one of the sub-regions to expose the first major surface underneath; and (Continued)

(ii) forming a pattern on the exposed first major surface within the one of the sub-regions.

19 Claims, 7 Drawing Sheets

(56) References Cited

U.S. PATENT DOCUMENTS

| | | | |
|---|---|---|---|
| 6,358,442 B1 * | 3/2002 | Delaney | B29C 43/18 264/1.36 |
| 7,727,453 B2 | 6/2010 | Sreenivasan et al. | |
| 9,790,396 B2 | 10/2017 | Klun et al. | |
| 2001/0012593 A1 | 8/2001 | Chang et al. | |
| 2003/0213382 A1 * | 11/2003 | Kendale | G03F 7/0002 101/41 |
| 2004/0124566 A1 | 7/2004 | Sreenivasan et al. | |
| 2004/0217085 A1 * | 11/2004 | Jeans | B82Y 10/00 216/4 |
| 2008/0248261 A1 * | 10/2008 | Bonnett | B41M 7/0045 428/423.1 |
| 2009/0166317 A1 * | 7/2009 | Okushima | G03F 7/0002 216/11 |
| 2011/0221095 A1 | 9/2011 | Sreenivasan et al. | |
| 2011/0250401 A1 * | 10/2011 | Dudley | H10K 77/111 524/556 |
| 2012/0091629 A1 | 4/2012 | Kruijt-Stegeman et al. | |
| 2013/0224322 A1 * | 8/2013 | Shizawa | B81C 1/00857 134/4 |
| 2013/0240480 A1 * | 9/2013 | Suzuki | B82Y 40/00 216/41 |
| 2015/0001746 A1 * | 1/2015 | Miyajima | B29C 59/002 425/167 |
| 2019/0134593 A1 | 5/2019 | Hall et al. | |

* cited by examiner

ARRAYED STRUCTURED REPLICATION ARTICLES AND METHODS

CROSS REFERENCE TO RELATED APPLICATIONS

This application is a national stage filing under 35 U.S.C. 371 of PCT/IB2021/061453, filed 8 Dec. 2021, which claims the benefit of U.S. Application No. 63/199,344, filed 21 Dec. 2020, the disclosure of which is incorporated by reference in its/their entirety herein.

BACKGROUND

Imprint lithography techniques have been widely investigated as alternatives to conventional photolithography for high-resolution patterning. Imprint lithography techniques generally use a template containing topography to replicate a surface relief on a substrate.

SUMMARY

Briefly, in one aspect, the present disclosure describes a method of forming an array of patterns on a substrate. The method includes providing a substrate including a first major surface; providing a tiling region on the first major surface of the substrate. The tiling region includes an array of sub-regions; providing a protective tile to cover each of the sub-regions, comprising depositing a layer of protectant resin within each sub-region, and solidifying the protectant resin to form an array of the protective tiles corresponding to the array of sub-regions; and sequentially repeating steps (i) and (ii) for each sub-region to form an array of patterns on the array of sub-regions of the substrate: (i) removing the protective tile from one of the sub-regions to expose the first major surface underneath; and (ii) forming a pattern on the exposed first major surface within the one of the sub-regions.

The step (ii) may further include providing a replication medium on one of (a) a relief structure of a patterned template and (b) the selected one of the sub-regions of the substrate; contacting the replication medium on one of (a) the relief structure of the patterned template and (b) the selected one of the sub-regions of the substrate with the other of (a) the relief structure of the patterned template and (b) the selected one of the sub-regions of the substrate; and removing the patterned template from the selected one of the sub-regions of the substrate.

Various unexpected results and advantages are obtained in exemplary embodiments of the disclosure. One such advantage of exemplary embodiments of the present disclosure is that each sub-region of the substrate can be rendered substantially free of particulate contaminants including ultra-fine particles via the removal of each protective tile immediately preceding the forming a pattern thereon. Another such advantage of exemplary embodiments of the present disclosure is that sub-regions adjacent to the subregion being patterned remain protected from damage and/or contamination during the pattern forming process.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The terms "(co)polymer" or "(co)polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

The term "protectant resin" refers to a film or a film forming composition of monomer, polymer, solvent, and/or other additives composed so as to substantially protect a surface from damage or contamination when disposed on the surface.

The term "protective tile" refers to a film of protectant resin, substantially solid, disposed on a surface such that at least a portion of the surface is covered by said film of protectant resin and thereby protected from damage or contamination.

The terms "about" or "approximately" with reference to a numerical value or a shape means +/− five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof. Various exemplary embodiments of the disclosure will now be described with particular reference to the Drawings.

Figure 1A:
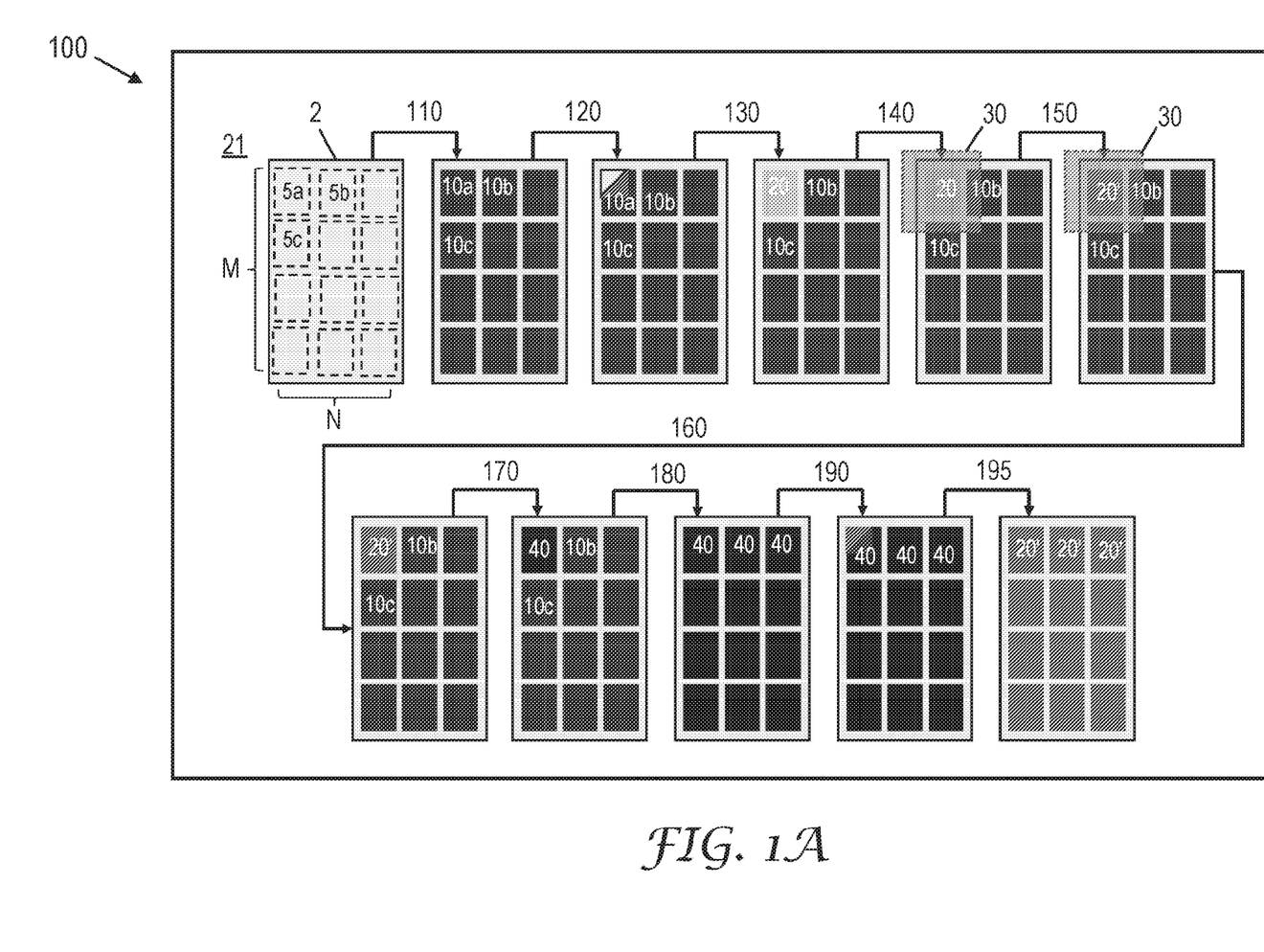
FIG. 1A is a schematic diagram of a process for forming an array of patterns on a substrate, according to one embodiment.
Figure 1B:
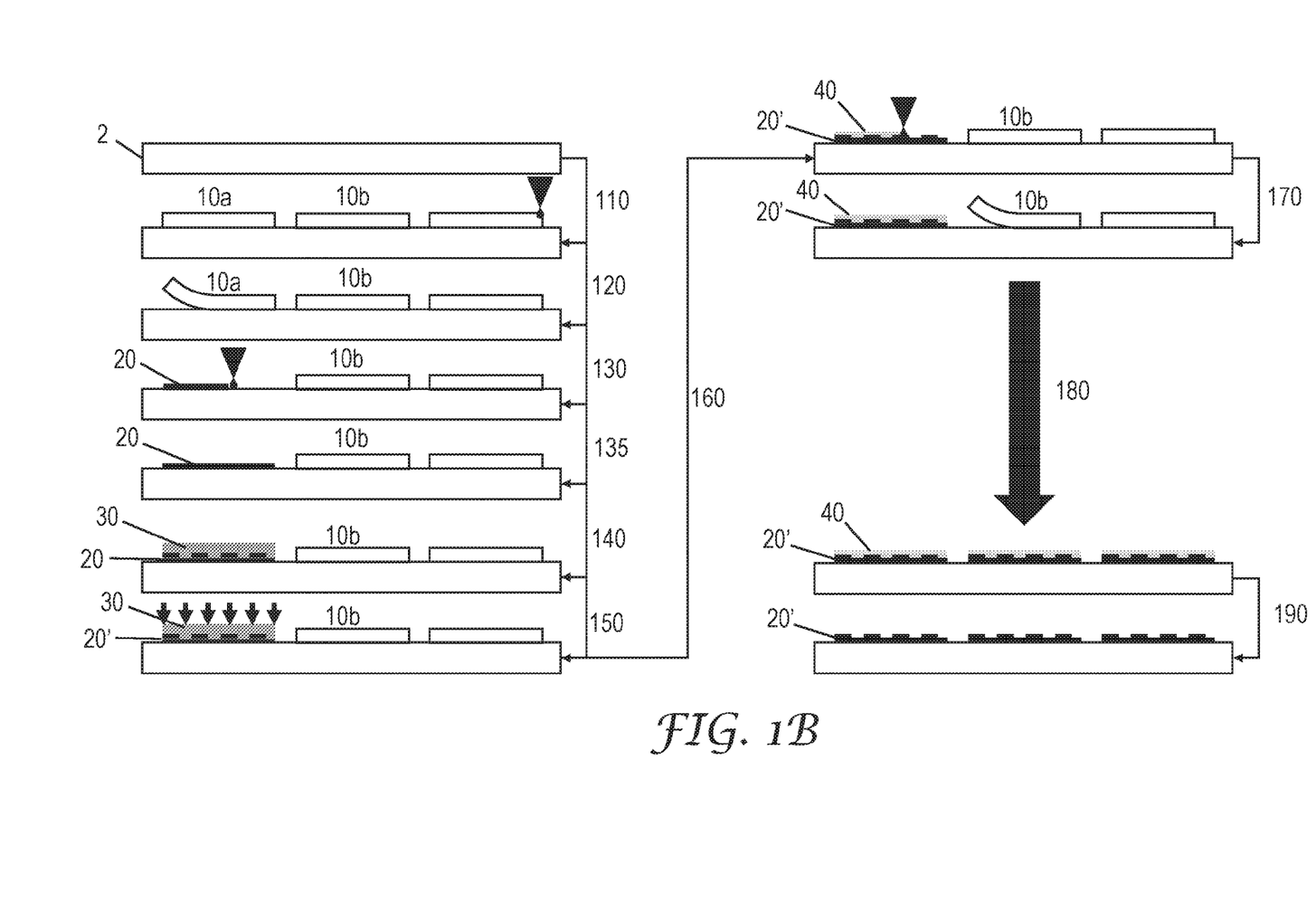
FIG. 1B is a cross-sectional schematic diagram of the process of FIG. 1A.

FIG. 1A is a schematic diagram of a process 100 for forming an array of patterns on a substrate, according to one embodiment. FIG. 1B is a cross-sectional view of the process of FIG. 1A. The substrate 2 may include flexible polymeric substrates, glass, quartz, silicon wafers, polished metal, rigid polymer substrates, etc. A tiling region is provided on the first major surface 21 of the substrate 2. The tiling region includes an array of sub-regions 5a, 5b, 5c, etc. (e.g., an M×N matrix, where M=1, 2, 3, etc., and N=1, 2, 3, etc.). The sub-regions may have an average area, for example, in a range from 1 $mm^2$ to 2000000 $mm^2$. A gap between the adjacent sub-regions may be in a range, for example, from about 0 mm to 100 mm. The array of sub-regions may include, for example, from 2 to 10000 sub-regions regularly or irregularly arranged on the first major surface of the substrate. Typically, sub-regions of a substrate can be pre-cleaned in an ultrasonic water-detergent bath and subsequently $O_2$ plasma treated to remove residual detergent.

At 110, protective tiles (10a, 10b, 10c, etc.) are provided to cover each of the sub-regions 5a, 5b, etc. In the depicted embodiment, each tile of the array of patterns has a rectangular shape. A layer of protectant resin is deposited onto each sub-region. The protectant resin is solidified to form an array of the protective tiles (e.g., 10a, 10b, 10c, etc.) corresponding to the array of sub-regions (e.g., 10a, 10b, 10c, etc.).

In many applications, the first major surface 21 of the substrate 2 may be contaminated thereon with an unacceptable number and size of particles. When coated on the first major surface 21 of the substrate 2, the protectant resin may be flowable and then solidified into a protective tile so as to capture all or a substantial amount of the particles contaminating the sub-regions on the substrate surface. The flowable protectant resin can capture the particles on the surface typically by physically surrounding at least a portion of each of the captured particles. The particles are captured when the coated material solidifies into the layer. Depending on the exact composition of the flowable protectant resin, the solidification of material may be accomplished through drying, cooling, heat curing, radiation curing, polymerization from reactive precursors, or the like. In a roll-to-roll process, it is usually convenient to perform the solidifying while the substrate (e.g., a web) is being conveyed in a continuous motion in the machine direction.

Suitable protectant resin compositions for the substrate 2 may include acrylates such as, for example, radiation curing acrylates, monomeric acrylates, oligomeric acrylates, urethane acrylates, silicone acrylates, fluorinated acrylates, ethoxylated acrylates including, for example, ethoxylated trimethylolpropane triacrylate and preferably six-mole ethoxylated trimethylolpropane triacrylate. In some embodiments, suitable protectant resin compositions for the substrate may also include thermoplastic polymers including polyvinyl alcohol, polyvinyl butyral, polymethyl methacrylate, polystyrene, reactive polymers including, for example, acrylate or vinyl functionalized polystyrene or polymethyl methacrylate, polyolefins including, for example cyclic polyolefin copolymers. In some embodiments, suitable protectant resin compositions for the substrate may further include epoxies including, for example, silicone epoxies, fluorinated epoxies, and radiation curing epoxies. In some embodiments, suitable protectant resin compositions for the substrate may further include polymers formed by ring opening metathesis polymerization.

In some embodiments, suitable protectant resin composition for the substrate may also include various blends of above listed materials additionally including solvents and functional additives such as, for example, surfactants plasticizers, and photoinitiators including diphenyl(2,4,6-trimethylbenzoyl)phosphine oxide.

For example, a suitable protectant resin composition for the substrate may include a blend of multiple commercial grades of polyvinyl alcohol in an aqueous solution, preferably commercial grades of polyvinyl alcohol between 80 and 95% hydrolyzed, preferably with average molecular weight between 9,000 and 124,000, preferably a blend of polyvinyl alcohol with average molecular weight between 31,000-50,000, and polyvinyl alcohol with average molecular weight between 85,000-124,000, and more preferably a blend comprising 50:50 ratio by weight of polyvinyl alcohol with average molecular weight between 31,000-50,000 and polyvinyl alcohol with average molecular weight between 85,000-124,000 in an aqueous solution with concentration in the range from 5-50%, preferably with concentration in the range from 10-25%. For example, a suitable protectant resin composition for the substrate may include a colloidal dispersion of polyurethane in water.

Suitable protectant resin compositions can be unreactive with various adhesion promoters which may be disposed on the first major surface 21 of the substrate 2. Suitable protectant resin compositions can have high enough strength and low enough adhesion to the first major surface 21 of the substrate 2 in order to be peeled from said surface without breakage. Suitable protectant resin compositions can be homogenous and solid at a temperature of at least about 25 degrees Celsius with no constitutive components having melt temperature or glass transition temperature below this threshold so that no residual film is left on the first major surface 21 of the substrate 2 upon peeling said resin from said surface.

In some embodiments, secondary carrier films can be laminated on the protective tiles after the protective tiles are attached to the sub-regions. The lamination of the secondary carrier film can make it easier to remove the protective tiles from the sub-regions. In some embodiments, the secondary carrier films can be applied via a roller. Exemplary secondary carrier films may include polycarbonate, polyethylene terephthalate, polyethylene terephthalate glycol, or polyvinyl alcohol.

At 120, at least one of the protective tiles (e.g., at least one of 10a, 10b, 10c, etc.) is removed from one of the sub-regions (e.g., 5a, 5b, 5c, etc.) to expose the first major surface of the substrate underneath. In some embodiments, the protective tile can be removed from the sub-region by peeling the protective tile from the substrate. After removing the protective tile, the sub-regions can be substantially free of ultra-fine particles having a diameter of at least about 0.1 micrometers and larger particles.

At 130, a replication medium 20 is provided on the exposed sub-region of the substrate 2. The replication medium 20 can be solidified by drying or curing at 135 of FIG. 1B. The suitability of replication medium is highly dependent on other process parameters including, for example, chemical and mechanical properties of the patterned template, geometry of the relief structure of the patterned template, and the method of patterning. Exemplary replication medium may include radiation curing monomers, polymers, oligomers, solvents, functional additives such as surfactants or others, a combination thereof, etc.

Suitable replication media compositions 20 may include acrylates including radiation curing acrylates, monomeric acrylates, oligomeric acrylates, urethane acrylates, silicone acrylates, fluorinated acrylates, ethoxylated acrylates including, for example, ethoxylated trimethylolpropane triacrylate and preferably six-mole ethoxylated trimethylolpropane triacrylate. Suitable replication media compositions may also include thermoplastic polymers including polyvinyl alcohol, polyvinyl butyral, polymethyl methacrylate, polystyrene, reactive polymers including, for example, acrylate or vinyl functionalized polystyrene or polymethyl methacrylate, polyolefins including, for example cyclic polyolefin copolymers. Suitable replication media compositions may also include epoxies including, for example, silicone epoxies, fluorinated epoxies, and radiation curing epoxies. Suitable replication media compositions may also include polymers formed by ring opening metathesis polymerization.

Suitable replication media compositions may also include various blends of above listed materials additionally including solvents and functional additives such as, for example, surfactants plasticizers, and photoinitiators including diphenyl(2,4,6-trimethylbenzoyl)phosphine oxide.

For example, a suitable replication media composition may include a blend of multifunctional acrylates and silicone acrylates, preferably a composition of trimethylolpropane triacrylate and EBECRYL 350, including a photoinitiator such as, for example, diphenyl(2,4,6-trimethylbenzoyl)phosphine oxide, preferably a composition with weight ratio of trimethylolpropane triacrylate, EBECRYL 350, and diphenyl(2,4,6-trimethylbenzoyl)phosphine oxide in the range of 30:70:1 to 70:30:2, and more preferably a composition with weight ratio of trimethylolpropane triacrylate, EBECRYL 350, and diphenyl(2,4,6-trimethylbenzoyl)phosphine oxide in the range of 55:45:1 to 65:35:2. For example, suitable replication media compositions may include blends of (mercaptopropyl)methylsiloxane and triallyl cyanurate. For example, suitable replication media compositions may include blends of reactive polymers and reactive monomers, preferably including thermoplastic reactive polymers.

Suitable replication medium may include resins having a glass transition temperature greater than ° C. when the resins are solidified by drying or curing. Suitable replication medium may include resins having an elastic modulus greater than 300 MPa when the resins are solidified by drying or curing.

The replication medium 20 has a thickness, for example, in a range from 10 nm to 1000 micrometers. The replication medium 20 can be provided on to the exposed, one or more sub-regions of the substrate by any suitable deposition methods such as, for example, digital printing, flexo-printing, stencil printing, needle coating, etc.

In some embodiments, an adhesion promoter may be included as an additive in the replication medium or may be deposited on the substrate in the same manner as the replication medium prior to deposition of the resin. The adhesion promoter layer can be provided on the exposed sub-region of the substrate 2 to promote the adhesion of the replication medium 20 to the sub-region of the substrate. Exemplary adhesion promoter may include a silane coupling agent, polyamide, etc.

At 140, a relief structure of a patterned template 30 is provided to contact the replication medium to replicate a pattern from the relief structure to the replication medium 20. The pattern can contain microscale and/or nanoscale feature(s) in a regular or random arrangement. The replication can be applied by imprinting at least one working stamp or the patterned template by lamination of the working stamp to the substrate. The lamination of the working stamp and the substrate may be achieved by working stamp-wide roller lamination, by manual lamination, by substrate-wide precision roll lamination, by deformable (membrane or compliant) lamination device, etc.

In some embodiments, the patterned template 30 may be oversized. In other words, the patterned template 30 may have a footprint greater than the sub-region to be covered. As shown in FIG. 1, the patterned template 30 is oversized to completely cover the sub-region 5a (covered by the protective tile and also partially cover adjacent sub-regions 5b and 5c (covered by the protective tile 10b and 10c, respectively). The patterned template 30 may have a contacting area at least 10%, at least 30%, at least 50%, at least 70%, or at least 90% greater than the surface area of the sub-region.

Figure 2A:
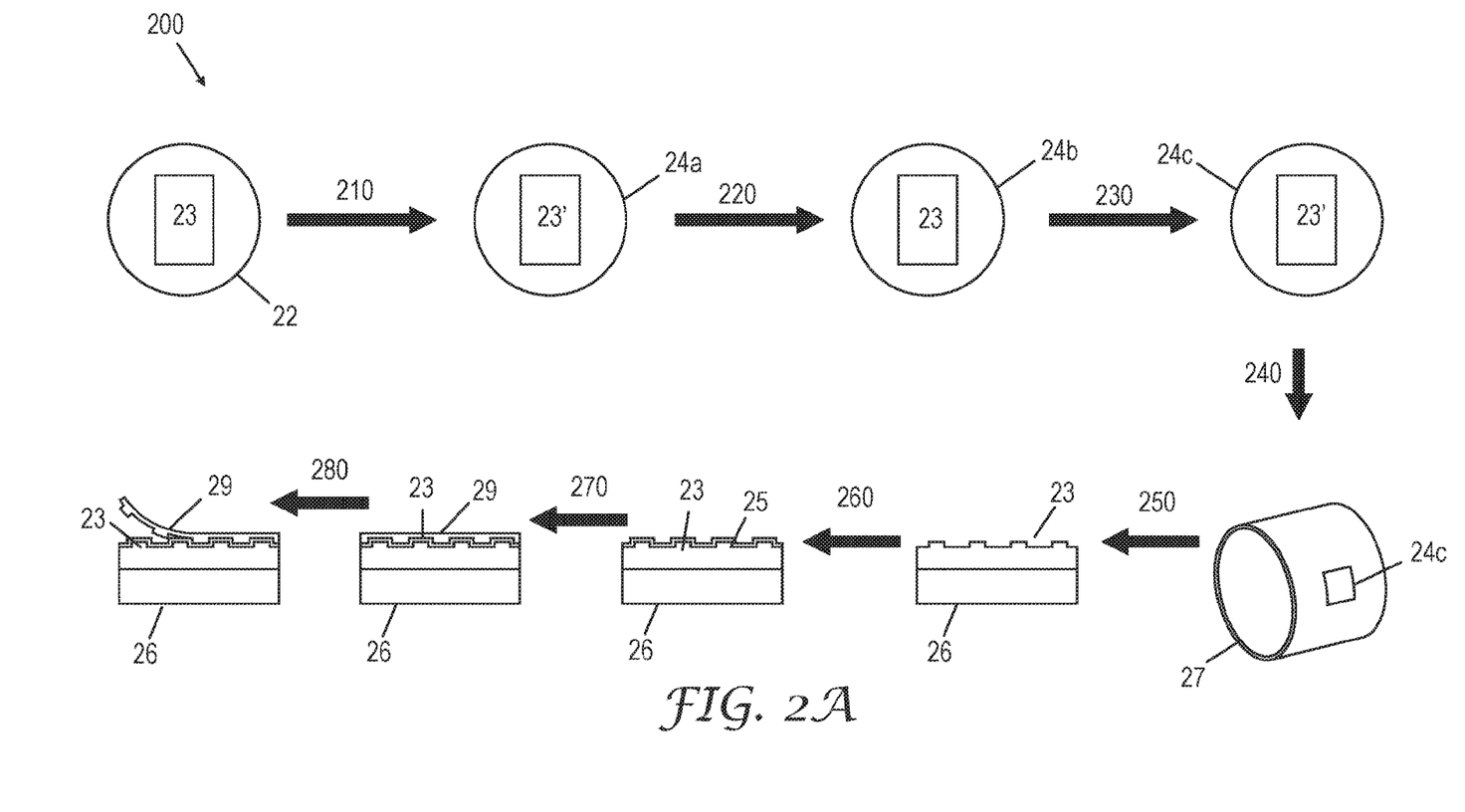
FIG. 2A is a schematic diagram of a process for forming a patterned template, according to one embodiment.

Exemplary methods of making a working stamp or patterned template will be described further below. One embodiment is depicted in FIG. 2A. The relief structure of the patterned template 30 can be cleaned before contacting the replication medium with the relief structure. In some embodiments, the patterned template 30 can be cleaned by peeling a layer of protectant resin from the relief structure. The relief structure can be substantially free of ultra-fine particles having a diameter of at least about 0.1 micrometers and larger particles after peeling off the protectant resin.

Suitable protectant resin compositions for protecting and cleaning the patterned template 30 may include acrylates including radiation curing acrylates, monomeric acrylates, oligomeric acrylates, urethane acrylates, silicone acrylates, fluorinated acrylates, ethoxylated acrylates including, for example, ethoxylated trimethylolpropane triacrylate and preferably six-mole ethoxylated trimethylolpropane triacrylate. Suitable protectant resin compositions for the template may also include thermoplastic polymers including polyvinyl alcohol, polyvinyl butyral, polymethyl methacrylate, polystyrene, reactive polymers including, for example, acrylate or vinyl functionalized polystyrene or polymethyl methacrylate, polyolefins including, for example cyclic polyolefin copolymers. Suitable protectant resin compositions for the template may also include epoxies including, for example, silicone epoxies, fluorinated epoxies, and radiation curing epoxies. Suitable protectant resin compositions for the substrate may also include polymers formed by ring opening metathesis polymerization.

Suitable protectant resin composition for the template may also include various blends of above listed materials additionally including solvents and functional additives such as, for example, surfactants plasticizers, and photoinitiators including diphenyl(2,4,6-trimethylbenzoyl)phosphine oxide.

For example, a suitable protectant resin composition for the template may include a blend of multiple commercial grades of polyvinyl alcohol in an aqueous solution, preferably commercial grades of polyvinyl alcohol between 80 and 95% hydrolyzed, preferably with average molecular weight between 9,000 and 124,000, preferably a blend of polyvinyl alcohol with average molecular weight between 31,000-50,000, polyvinyl alcohol with average molecular weight between 85,000-124,000, and glycerol, and more preferably a blend comprising 45:45:10 ratio by weight of polyvinyl alcohol with average molecular weight between 31,000-50,000, polyvinyl alcohol with average molecular weight between and glycerol in an aqueous solution with concentration in the range from 5-50%, preferably with concentration in the range from 10-25%. For example, a suitable protectant resin composition for the template may include a colloidal dispersion of polyurethane in water.

In some embodiments, the replication medium 20 can be first provided onto the patterned template instead of directly on the exposed sub-region of the substrate 2. In the embodiment illustrated in FIG. 1C, at 130', the patterned template 30 having a relief structure 31 is provided to contact to the exposed sub-region of the substrate 2. At 135', the replication medium 20 is provided onto the relief structure 31 of the patterned template 30 to replicate a pattern from the relief structure to the replication medium 20. At 140, the patterned template 30 along with the replication medium 20 is provided to contact the sub-region of the substrate. Suitable deposition methods may include, for example, overcoating or printing methods. Overcoating methods may include, for example, die coating, spray coating, vapor coating, dip coating, spin coating etc. Printing methods may include, for example, digital printing (e.g., inkjet printing, valve jet printing, etc.), flexo-printing, stencil printing, etc.

Figure 1C:
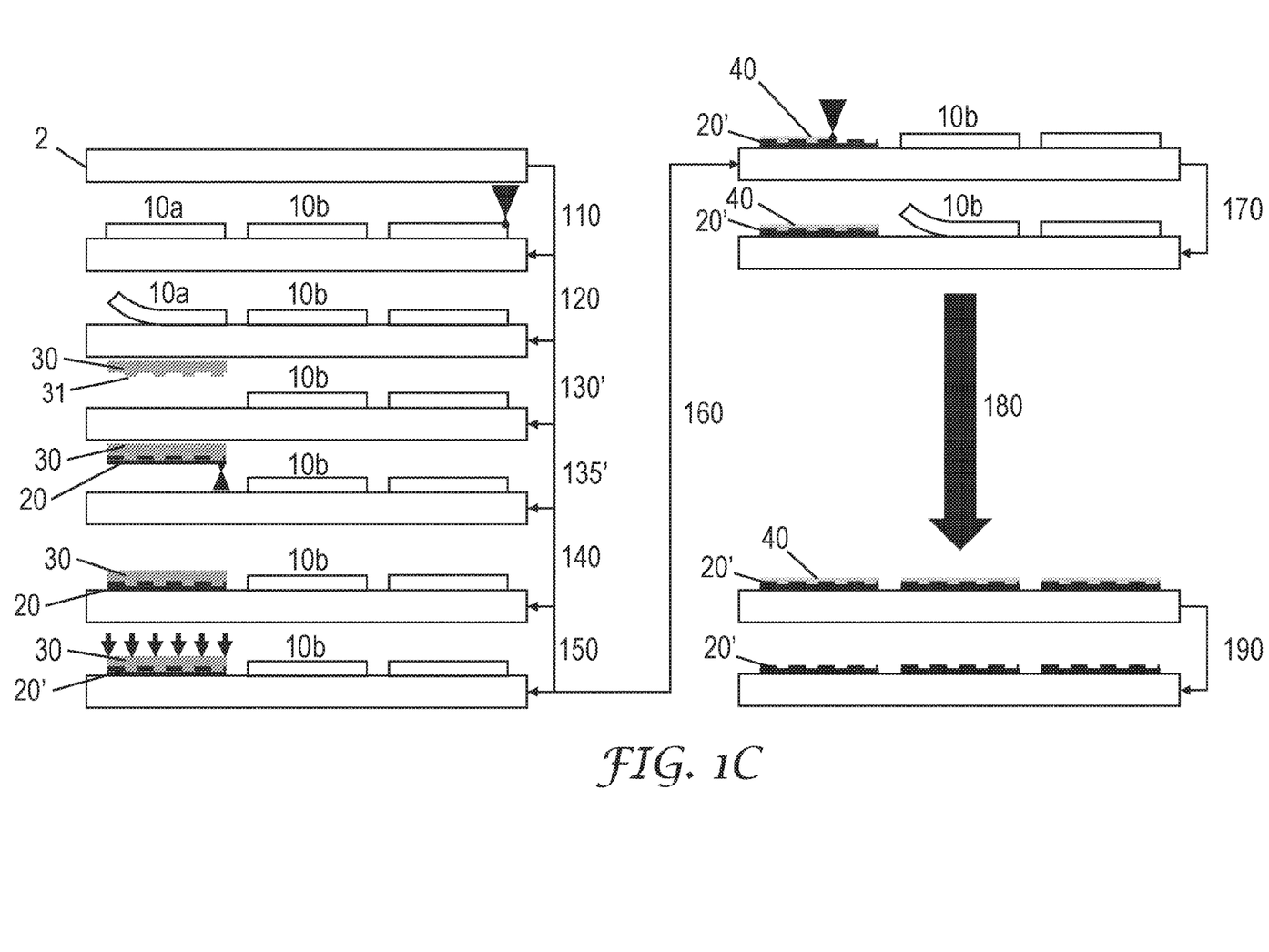
FIG. 1C is a cross-sectional schematic diagram of a process for forming an array of patterns on a substrate, according to another embodiment.

In some embodiments, an ink can be provided onto a relief structure of a patterned template, for example, the relief structure 31 of the patterned template 30 of FIG. 1C. The inked relief structure is then provided to contact to the sub-region of the substrate to form a replication pattern on the sub-region. The steps can be repeated for each sub-region to form the replication pattern on each sub-region of the substrate. A suitable ink may include a functionalizing molecule with a functional group selected to chemically bind to the first major surface within the sub-region when the relief structure contacts to the sub-region. The patterned template can be positioned to contact with the first major surface within the sub-region to form a self-assembled monolayer (SAM) of the functionalizing material on the first major surface within the sub-region and impart the arrangement of pattern elements thereto. A typical method for microcontact printing SAMs involves applying an ink containing the functionalizing molecules to a relief-patterned elastomeric stamp (for example, a poly(dimethylsiloxane) (PDMS) stamp) and then contacting the inked stamp to a substrate surface, so that SAMs form in the regions of contact between the stamp and the substrate. Exemplary methods of microcontact printing with high relief stamps in a roll-to-roll process were described in PCT publication No. WO 2014/105633 (Pekurovsky et al.), which is incorporated herein by reference.

At 150, the replication medium 20 is cured to form a replication pattern onto the cured resin 20' before removing the patterned template from the sub-region. One or more energy sources can be positioned such that emitted energy can cure the replication medium 20 while the resin 20 is in contact with both the relief structure of the patterned template 30 and the sub-region of the substrate. The energy source may be capable of emitting energy, e.g., UV radiation, e-beam radiation, or heat. When the energy source emits radiation, the recipient substrate and/or the patterned template can be substantially transparent to the radiation to allow curing of the replication medium 20.

At 160, after the replication medium 20 is cured, the patterned template 30 is removed from the sub-region to expose the formed replication pattern on the cured replication medium 20'.

At 170, a protective layer 40 is provided to cover the formed replication pattern on the cured resin 20' within the sub-region. The protective layer 40 may be a washable or strippable protective layer. The protective layer 40 may include a protectant resin such as, for example, polymer-solvent dispersions, polymer solvent solutions, reactive polymer solutions, ionic networking acrylate, radiation curing monomers, oligomers, thermoplastics, etc.

Suitable protectant resin composition 40 for protecting and cleaning the replication pattern 20' may include acrylates including radiation curing acrylates, monomeric acrylates, oligomeric acrylates, urethane acrylates, silicone acrylates, fluorinated acrylates, ethoxylated acrylates including, for example, ethoxylated trimethylolpropane triacrylate and preferably six-mole ethoxylated trimethylolpropane triacrylate. Suitable protectant resin compositions for the replication pattern may also include thermoplastic polymers including polyvinyl alcohol, polyvinyl butyral, polymethyl methacrylate, polystyrene, reactive polymers including, for example, acrylate or vinyl functionalized polystyrene or polymethyl methacrylate, polyolefins including, for example cyclic polyolefin copolymers. Suitable protectant resin compositions for the replication pattern may also include epoxies including, for example, silicone epoxies, fluorinated epoxies, and radiation curing epoxies. Suitable protectant resin compositions for the replication pattern may also include polymers formed by ring opening metathesis polymerization.

Suitable protectant resin composition for the replication pattern may also include various blends of above listed materials additionally including solvents and functional additives such as, for example, surfactants plasticizers, and photoinitiators including diphenyl(2,4,6-trimethylbenzoyl) phosphine oxide.

For example, a suitable protectant resin composition for the replication pattern may include a blend of multiple commercial grades of polyvinyl alcohol in an aqueous solution, preferably commercial grades of polyvinyl alcohol between 80 and 95% hydrolyzed, preferably with average molecular weight between 9,000 and 124,000, preferably a blend of polyvinyl alcohol with average molecular weight between 31,000-50,000, polyvinyl alcohol with average molecular weight between 85,000-124,000, and glycerol, and more preferably a blend comprising 45:45:10 ratio by weight of polyvinyl alcohol with average molecular weight between 31,000-50,000, polyvinyl alcohol with average molecular weight between 85,000-124,000, and glycerol in an aqueous solution with concentration in the range from 5-50%, preferably with concentration in the range from 10-25%. For example, a suitable protectant resin composition for the replication pattern may include a colloidal dispersion of polyurethane in water.

Suitable methods of deposition the protective layer on the replication pattern may include overcoating or printing methods. Overcoating methods may include, for example, die coating, spray coating, vapor coating, dip coating, spin coating etc. Printing methods may include, for example, digital printing (inkjet printing, valve jet printing, etc.), flexo-printing, stencil printing, etc.

At 180, the steps from 120 to 170 are repeated for each of the rest of the sub-regions to form a replication pattern within each sub-region. In some embodiments, the can be completed in the order listed for each subregion in order to benefit from the process design (e.g., to complete steps 120 through 170 for subregion 1, then complete steps 120 through 170 for subregion 2; don't do step 120 for subregions 1 and 2, then step 130 for subregions 1 and 2, etc.). In some embodiments, the steps can be repeated by using one or more patterned templates (e.g., from one up to the number of subregions). The steps can be repeated to pattern a large area with fine features as compared to conventional direct patterning methods. The protective layers used herein can eliminate opportunities for particulate contamination and damage in the step and repeat process.

At 190 (and 195 in FIG. 1A), the protective layers 40 can be selectively removed from the respective sub-regions of the substrate to reveal the underneath cured resin 20'. The revealed replication patterns on the cured resin 20' can be used for various applications. The replication pattern can contain microscale and/or nanoscale feature(s) in a regular or random arrangement. After removing the protective layers 40, the replication patterns on the cured resin 20' can be substantially free of ultra-fine particles having a diameter of at least about 0.1 micrometers and larger particles.

In some embodiments, a patterned template or a stamp, such as the patterned template 30 in FIG. 1, can be made by applying an overcoat on a master tool, curing the overcoat, and separating the cured overcoat from the master tool to form the patterned template. The overcoat may be a UV-curable resin including at least one of acrylate monomers, acrylate oligomers, UV-curable epoxies, silicone, or silicone acrylate. The relief structure of the patterned template may be a structured surface including an arrangement of pattern elements extending away from a base surface thereof. The pattern elements may have an average lateral dimension in a range, for example, from about 1 nm to 1000 micrometers, and an aspect ratio of height to the lateral dimension in a range, for example, from about 0 to 20.

FIG. 2A is a schematic diagram of a process 200 for forming a stamp having a patterned template, according to one embodiment. A direct-write lithography technique is used to generate a master 22. Exemplary direct-write lithography technique may include e-beam lithography, two-photon lithography, direct-write lithography, etc. The master 22 has a microscale or nanoscale pattern 23 created on a major surface thereof. An exemplary master can be a silicon wafer. At 210, 220 and 230, the patterned features on the master 22 (Gen 0 master) can be replicated to generate daughters of the same or oppose feature polarity that will be henceforth referred to Gen N (N=1, 2, etc.) masters 24a-c having a pattern 23' or 23 complementary to the pattern on its master. Suitable processes such as, for example, Ni electroplating, nano-imprint copies, etc., can be used to generate the Gen N masters. The Gen N masters 24a-c can be made with materials such as, for example, silicon, quartz, nickel, etc. The pattern can contain microscale and/or nanoscale feature(s) in a regular or random arrangement. It may contain both structured and unstructured area. Working stamps can be created from a master (e.g., the Gen N masters 24a-c) via a number of steps.

The working stamps can be created through imprint patterning of a material. Imprint patterning can be done by coating the material on the master or a working stamp carrier, bringing the coating in contact with the complementary or working stamp carrier, setting or curing through a number of possible mechanisms (ultra-violet (UV) light, thermal, drying, etc.), and separating from the master. The working stamp material can include, for example, acrylates, silicone acrylates, fluorinated acrylates, water dissolvable material (polyvinyl alcohol (PVA), an ionic networking acrylate (W3), polyvinylpyrrolidone (PVP), starches, etc.), thermal plastics (polycarbonate, cyclic olefin copolymer, polystyrene, polymethmethacrylate, etc.), etc. The working stamp may include a working stamp carrier which can contain one or more of the following: a polymer film (PET, PC, etc.), a film with a UV or thermally de-activatable pressure sensitive adhesive (PSA), a film with a water dissolvable tie layer where the water dissolvable tie layer can be PVA, compliant layers such as polydimethylsiloxane (PDMS), etc.

Polydimethylsiloxane (PDMS) is particularly useful as a stamp material, as it is elastomeric and has a low surface energy (which makes it easy to remove the stamp from most substrates). A useful commercially available formulation is available from Dow Corning, Midland, MI, under the trade designation Sylgard 184 PDMS. PDMS stamps can be formed, for example, by dispensing an un-crosslinked PDMS polymer into or against a patterned mold, followed by curing. The master tool for molding the elastomeric stamps can be formed using photolithography techniques known in the art. The elastomeric stamp can be molded against the master tool by applying uncured PDMS to the master tool and then curing.

A Gen N master having the patterned template may be used as the working stamp which may further include a flexible film. In the embodiment depicted in FIG. 2A, the master 24c is attached to a sleeve 927 at 240 and the pattern 23' is replicated onto a tooling film 26 at 250. The tooling film 26 includes a flexible film 26a and a pattern 23 on its major surface. The tooling film 26 can serve as a patterned template or working stamp.

Figure 2B:
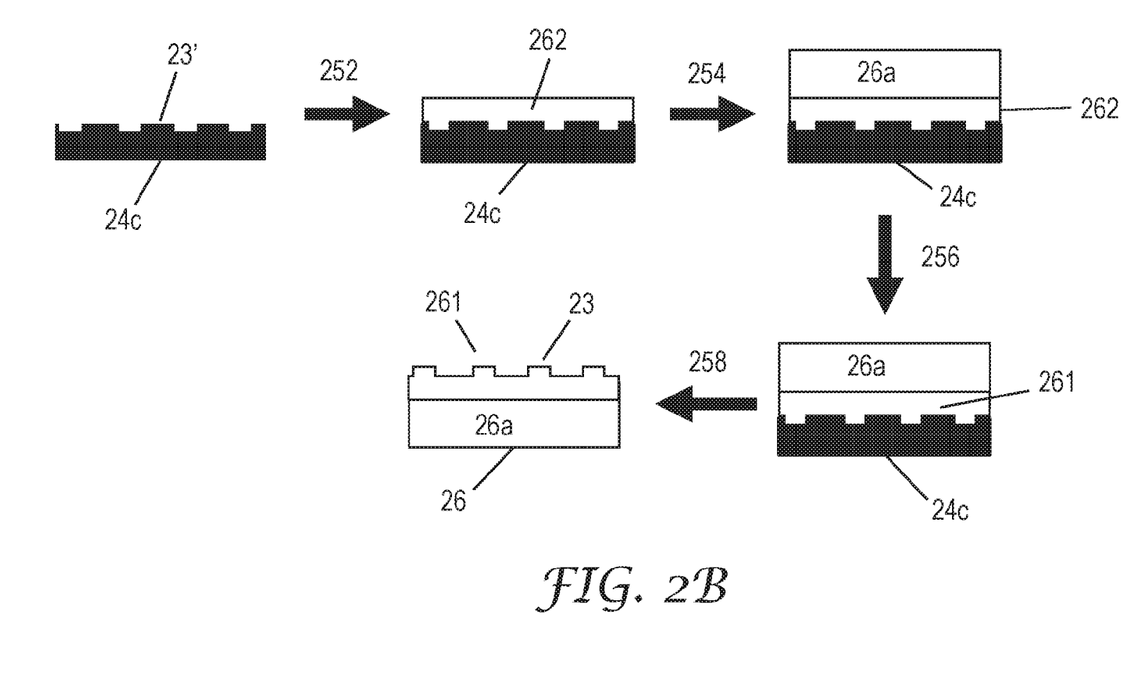
FIG. 2B is a schematic diagram of a process for replicating a pattern from the patterned template of FIG. 2A.

In the embodiment depicted in FIG. 2B, a template material 262 is applied on the pattern 23' of the master 24c at 252 to replicate the pattern 23' to the template material 262. The template material may include, for example, radiation curing acrylates including, for example, monomeric or oligomeric acrylates, urethane acrylates, silicone acrylates, fluorinated acrylates, ethoxylated acrylates, ionic networking acrylates, epoxies including, for example silicone epoxies, fluorinated epoxies, radiation curing epoxies, thermoplastic polymers including for example, polyvinyl alcohol, polyvinyl butyral, polymethyl methacrylate, polystyrene, solvents, functional additives including surfactants, plasticizers, photoinitiators and the like, or combinations thereof. The layer of template material may have a thickness, for example, between 10 nm and 1000 micrometers. At 254, the flexible film 26a is laminated onto the template material 262. At 256, the template material 262 is solidified via curing or drying to form the patterned template 26. At 258, the master 24c is removed from the patterned template 26. The formed patterned template 26 has a relief structure 261 including the pattern 23 thereon.

In some embodiments, the patterned template may include a release layer such as an organosilicon compound (e.g., hexamethyldisiloxane or HMDSO), a fluorinated coating, fluorinated monolayers, silicone coatings, or silicone monolayers. The working stamp 26 can be optionally release-treated at 260 with an organosilicon compound, a fluorinated monolayer, etc., to form a release layer 25 on the pattern 23. At 270, a protective layer 29 is applied to the pattern 23 on the working stamp 26. Application methods may include, for example, overcoating, printing, lamination, or a combination of these processes. Exemplary overcoating methods may include die coating, spray coating, vapor coating, dip coating, spin coating, etc. Exemplary printing methods include digital printing (inkjet, valve jet etc.), flexo-printing, stencil printing etc. Laminated protective layers include single or multilayer films with or without adhesive. Overcoated and printed protective layers include polymer-solvent dispersions, polymer solvent solutions, reactive polymer solutions, ionic networking acrylate, radiation curing monomers, oligomers, thermoplastics, etc. Overcoated and printed protective layers can be set or solidified by a number of methods including radiation curing, thermal curing, drying, etc.

Working stamps can be converted by removing any non-structured margins of the working stamp carrier. Converting methods may include, for example, press punch converting, rotary die cutting, laser cutting, scissor cutting, etc. Converting may include lamination of a carrier layer to allow for roll to roll handling of working stamps after converting. Working stamps may be kiss-cut to a carrier layer and left in a continuous roll or sheeted and packaged in-line as individual parts.

At 280, the protective layer 29 is removed from the pattern 23, and the working stamp 26 can be cleaned. Cleaning methods may include encapsulant stripping, solvent rinse, sonication, $CO_2$ snow cleaning etc. Solvent rinsing includes sequential rinses with solvents such as isopropanol, acetone, de-ionized water etc. Encapsulant stripping describes the removal of overcoated, printed, or adhesive protective layers where particles are encapsulated by or adhered to the protective lay in the application process and stripped from the working stamp when the protective layer is removed. Removal of the protective layer may be done with the aid of static neutralization including static string, nuclear type static bars, active static bars etc.

Articles and methods described herein have various applications. For example, it can be used to develop a process technology for making large area coverage nano-structured round tools for pattern replication Structured patterns with length scales on the order of microscale and nanoscale can be made on round tools. This provides a robust way of producing round tools with smaller features (e.g., nanoscale) and/or with patterns that are not conducive to traditional micro-structured tooling manufacturing routes such as diamond turning machines (DTMs).

Conventional DTMs can produce turned patterns with a constant cross-section helically around the tool. With advances in 2D fly cutting and fast tool servo, the structures can also have cube corners and spherical lenses. Furthermore, focused-ion-beam machining of the diamond tool has enabled cutting some sub-micron structures. However, limitations still exist because this method is fundamentally a turning operation, which may not be suitable for making certain patterns such as, for example, meta-material patterns. In contrast, some embodiments of the articles and methods described herein can be used to make such meta-material patterns.

In some embodiments, articles and methods described herein can be used for patterning nanostructured roll-to-roll (R2R) tooling which may have large feature sizes, limited pattern geometry, large step height changes between pattern and non-pattern areas, or unacceptably long patterning times, etc. A flexible tooling platform can be built with technical advantages including, for example (i) small feature size (e.g., smaller than 20 nm), (ii) 3-dimensional patterning capability, (iii) pre-mastered with patterns being taken from many sources such as e-beam lithography, 2-photon lithography, laser-direct write, diamond turned parts, etc., (iv) flexible material sets leveraging various polymer formulations, (v) much faster compared to inorganic equivalents (e.g. Ni plating), etc.

Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Listing of Exemplary Embodiments

Embodiment 1 is a method of forming an array of patterns on a substrate, the method comprising:
   providing a substrate including a first major surface;
   providing a tiling region on the first major surface of the substrate, wherein the tiling region comprises an array of sub-regions;
   providing a protective tile to cover each of the sub-regions, comprising depositing a layer of protectant resin within each sub-region, and solidifying the protectant resin to form an array of the protective tiles corresponding to the array of sub-regions; and
   sequentially repeating steps (i) and (ii) for each sub-region to form an array of patterns on the array of sub-regions of the substrate:
      (i) removing the protective tile from a selected one of the sub-regions to expose the first major surface underneath; and
      (ii) forming a pattern on the exposed first major surface within the selected one of the sub-regions.

Embodiment 2 is the method of embodiment 1, wherein the step (ii) further comprises:
  providing a replication medium on one of (a) a relief structure of a patterned template and (b) the selected one of the sub-regions of the substrate;
  contacting the replication medium on one of (a) the relief structure of the patterned template and (b) the selected one of the sub-regions of the substrate with the other of (a) the relief structure of the patterned template and (b) the selected one of the sub-regions of the substrate; and
  removing the patterned template from the selected one of the sub-regions of the substrate.

Embodiment 3 is the method of embodiment 2, further comprising curing the replication medium before removing the patterned template from the sub-region.

Embodiment 4 is the method of embodiment 2 or 3, further comprising cleaning the relief structure of the patterned template before contacting the replication medium with the relief structure.

Embodiment 5 is the method of embodiment 4, wherein after the cleaning, the relief structure is substantially free of ultra-fine particles having a diameter of at least about 0.1 micrometers and larger particles.

Embodiment 6 is the method of embodiment 4 or 5, wherein cleaning the relief structure of the patterned template further comprises peeling a layer of polymer resin from the relief structure.

Embodiment 7 is the method of embodiment 6, wherein the polymer resin comprises at least one of polyvinyl alcohol (PVA) or a UV-curable acrylate.

Embodiment 8 is the method of any one of embodiments 2-7, wherein the replication medium comprises radiation curing acrylate.

Embodiment 9 is the method of any one of embodiments 2-8, wherein the replication medium has a thickness in a range from 10 nm to 1000 micrometers.

Embodiment 10 is the method of any one of embodiments 2-9, further comprising applying an overcoat on a master tool, curing the overcoat, and separating the cured overcoat from the master tool to form the relief structure of the patterned template.

Embodiment 11 is the method of embodiment 10, wherein the overcoat comprises a UV-curable resin including at least one of acrylate monomers, acrylate oligomers, silicone, or silicone acrylate.

Embodiment 12 is the method of any one of embodiments 2-11, wherein the relief structure of the patterned template comprises a structured surface comprising an arrangement of pattern elements extending away from a base surface thereof, the pattern elements having an average lateral dimension in a range from about 1 nm to 1000 micrometers, and an aspect ratio of height to the lateral dimension in a range from about 0 to 20.

Embodiment 13 is the method of any one of embodiments 1-12, wherein the protectant resin comprises at least one of PVA or a UV-curable acrylate.

Embodiment 14 is the method of any one of embodiments 1-13, wherein removing the protective tile from the sub-region comprises peeling the protective tile from the substrate.

Embodiment 15 is the method of any one of embodiments 1-14, wherein the sub-region is substantially free of ultra-fine particles having a diameter of at least about 0.1 micrometers and larger particles after removing the protective tile.

Embodiment 16 is the method of any one of embodiments 1-15, wherein the step (ii) further comprises providing a pattern protectant resin on the pattern within the sub-region.

Embodiment 17 is the method of any one of embodiments 1-16, wherein the sub-regions have an average area in a range from 1 $mm^2$ to 2000000 $mm^2$.

Embodiment 18 is the method of any one of embodiments 1-17, wherein a gap between the adjacent sub-regions is in a range from about 0 mm to 100 mm.

Embodiment 19 is the method of any one of embodiments 1-18, wherein each tile of the array of patterns has a rectangular shape.

Embodiment 20 is the method of any one of embodiments 1-19, wherein the array of sub-regions comprises 2 to 10000 sub-regions regularly or irregularly arranged on the first major surface of the substrate.

Embodiment 21 is the method of any one of embodiments 1-20, wherein the array of sub-regions within the tiling region comprises a rectilinear array of sub-regions.

Embodiment 22 is the method of any one of embodiments 1-21, wherein the substrate comprises at least one of a flexible polymer, a rigid polymer, glass, quartz, a silicon wafer, or a polished metal.

Embodiment 23 is the method of any one of embodiments 1-22 wherein providing a protective tile to cover each of the sub-regions further comprises laminating a secondary carrier film for the protective tiles.

Embodiment 24 is the method of any one of embodiments 1-23, wherein the step (ii) further comprises:
  providing an ink on the relief structure of a patterned template, the ink comprising a functionalizing molecule with a functional group selected to chemically bind to the first major surface within the sub-region; and
  contacting the patterned template with the first major surface within the sub-region to form a self-assembled monolayer (SAM) of the functionalizing material on the first major surface within the sub-region and impart the arrangement of pattern elements thereto.

Embodiment 25 is the method of any one of embodiments 1-24, wherein the first major surface of the substrate comprises an adhesion promoter layer, optionally, including a silane coupling agent, or polyamide.

Embodiment 26 is the method of any one of embodiments 1-25, wherein the patterned template comprises a release layer, optionally, comprising at least one of an organosilicon compound, a fluorinated coating, a fluorinated monolayer, a silicone coating, or a silicone monolayer.

Embodiment 27 is the method of any one of embodiments 1-26, wherein the patterned template comprises a flexible film.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. Table 1 provides abbreviations and a source for all materials used in the Examples below:

TABLE 1

| Abbreviation | Description | Source |
| --- | --- | --- |
| EB350 | Silicone diacrylate obtained under the trade designation Ebecryl 350. | Allnex USA Inc., Alpharetta, Georgia |
| SR351 | Trimethylolpropane triacrylate obtained under the trade designation SR351 | Sartomer, Exton, Pennsylvania |
| PHOTOMER 6210 | Urethane acrylate oligomer obtained under the trade designation PHOTOMER 6210 | IGM Resins, Charlotte, NC |
| SR238 | 1,6-Hexandiol diacrylate obtained under the trade designation SR238 | Sartomer, Exton, Pennsylvania |
| IRGACURE TPO | Diphenyl(2,4,6-trimethylbenzoyl)phosphine oxide a photo initiator obtained under the trade designation IRGACURE TPO | BASF, Florham Park, NJ |
| High MW PVA | 87-89% hydrolyzed, average molecular weight 85,000-124,000, Polyvinyl Alcohol | MiliporeSigma, St. Louis, Missouri |
| Medium MW PVA | 87-89% hydrolyzed, average molecular weight 31,000-50,000, Polyvinyl Alcohol | MiliporeSigma, St. Louis, Missouri |
| Ethyl Lactate | Lactic acid ethyl ester | |
| DOWANOL PM | 1-Methoxy-2-Propanol | MiliporeSigma, St. Louis, Missouri |
| | 2-(3-trimethoxysilylpropylcarbamoyloxy)ethyl prop-2-enoate; assembled as described in Example 7 of U.S. Pat. No. 9,790,396 | 3M Company, St. Paul, Minnesota |
| HMDSO | Hexamethyldisiloxane | MiliporeSigma, St. Louis, Missouri |

Example 1: Use of Protectant Resin on Flat Substrates

Use of protectant resin to protect and clean flat substrates was demonstrated. A protectant resin composed of a solution of medium MW PVA and deionized water was prepared. The PVA was combined with deionized water at 20% PVA concentration by weight, brought to a temperature of 60 degrees Celsius in a convection oven, and allowed to dissolve over about 12 hours.

A Fischer 2×3 inch borosilicate microscope slide was imaged via differential interference contrast microscopy. The slide was coated with the PVA solution. The PVA solution was dispensed onto the surface of the slide with a pipette and drawn down with an RDS 20 Mayer rod. The slide was brought to a temperature of 60 degrees in a convection oven and allowed to dry for about 1 hour.

Figure 3A:
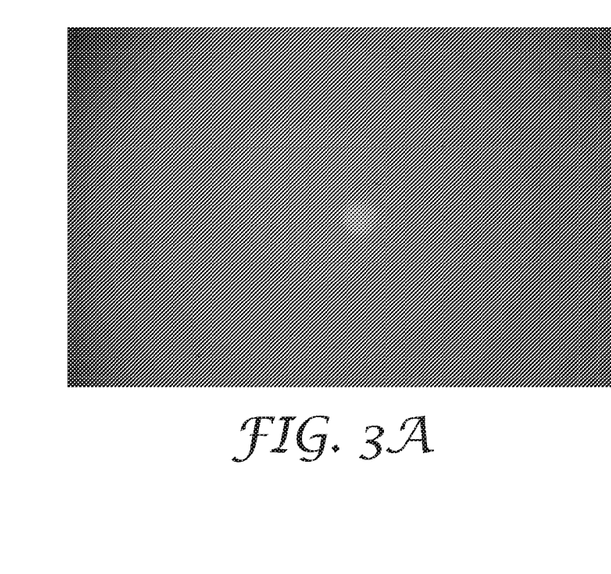
FIG. 3A is an image of a microscope slide (5×) before cleaning.
Figure 3B:
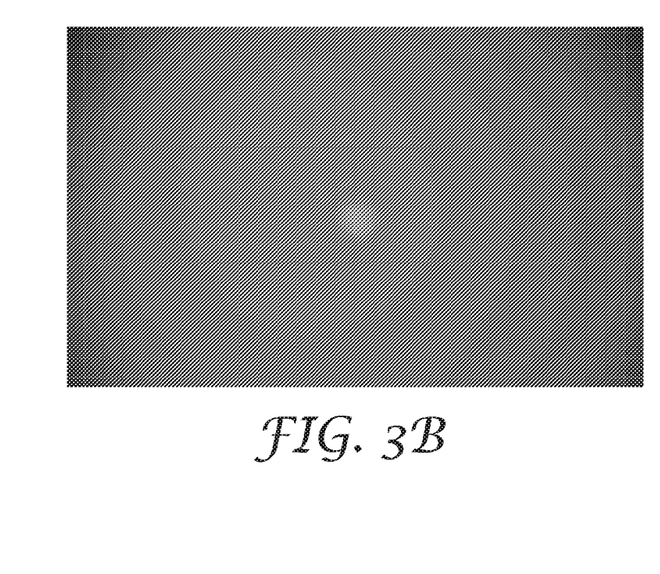
FIG. 3B is an image of the microscope slide (5×) of FIG. 3A after having the protectant resin stripped.

To evaluate the cleaning efficacy of the protectant resin composition, the PVA coating was peeled from the glass slide. A crack was initiated between the PVA and the slide with a razor blade and the film was peeled from the slide with SCOTCH tape (3M Company, St. Paul, MN). The exposed region of the slide was again imaged via differential interference contrast microscopy with an MX61L microscope (OLYMPUS CORPORATION, Tokyo, Japan). FIGS. 3A-B illustrate images of a cleaning result for PVA resin coated on a borosilicate microscope slide.

Example 2: Use of Protectant Resin on Structured Surfaces

Use of protectant resin to protect and clean patterned templates and replicated patterns was demonstrated. A protectant resin composed of a solution of blended medium MW PVA and high MW PVA and deionized water was prepared. A 50/50 blend of medium molecular weight PVA and high molecular weight PVA was combined with a 4:1 deionized water and ethanol solution at 20% PVA concentration by weight, brought to a temperature of 60 degrees Celsius in a convection oven, and allowed to dissolve over about 12 hours.

A patterned film was imaged via differential interference contrast microscopy. The PVA solution was coated onto a patterned film. The patterned film includes a silicon containing release layer assembled according to the "method for release treatment" described in WO2020/095258 over a 5-micron thick structured layer composed of PHOTOMER 6210, SR238, SR351, and IRGACUR TPO in weight ratios of 60/20/20/0.5 on a polycarbonate backing film with a thickness of 0.004 in. (X mm). The pattern of the patterned templates was an array of posts 150 nm in diameter and 450 nm in height.

Figure 4A:
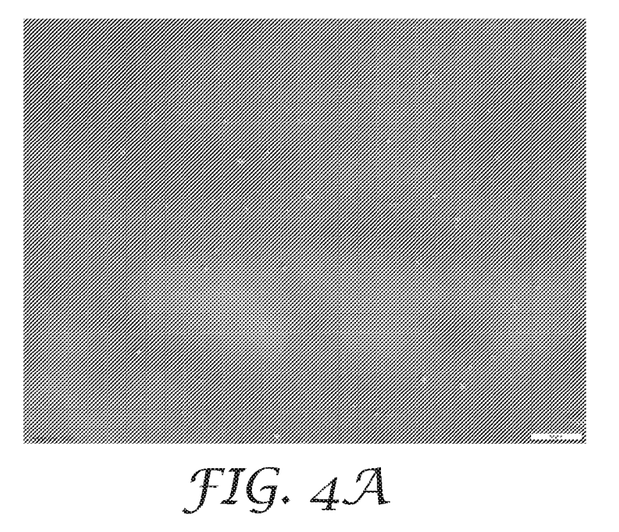
FIG. 4A is an image of a patterned template before cleaning.
Figure 4B:
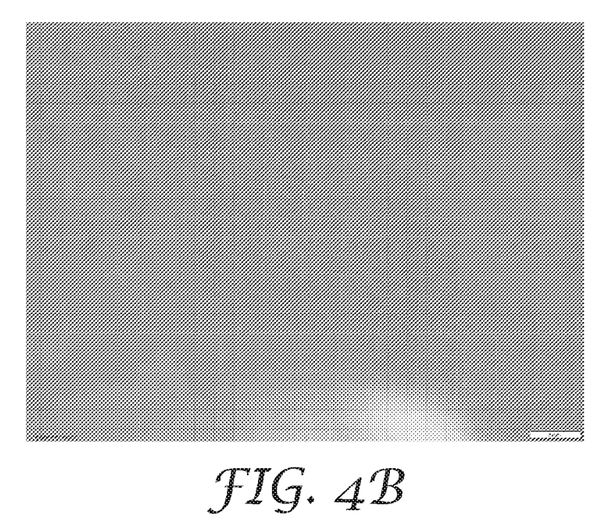
FIG. 4B is an image of the patterned template of FIG. 4A after having the protectant resin stripped.

The PVA solution was dispensed onto the surface of the patterned film with a pipette and drawn down with an adjustable notch bar set to 0.01 inch. The patterned film was brought to a temperature of 60 degrees in a convection oven and allowed to dry for about 1 hour. To evaluate the cleaning efficacy of the protectant resin composition, the PVA coating was peeled from the patterned film. The coating was peeled from the patterned film with SCOTCH tape. The exposed patterned film was again imaged via differential interference contrast microscopy. FIG. 4A is an image of the patterned film before cleaning. FIG. 4B is an image of the patterned film of FIG. 4A after peeling the coating.

Example 3: Use of Step and Repeat Patterning

The use of nanoimprinting to create tiled nanostructured substrates was demonstrated. A 370×470 mm borosilicate substrate was pre-cleaned in an ultrasonic bath of deionized water for 10 minutes. The substrate was subsequently cleaned by sequential deionized water, acetone, isopropanol, and deionized water rinses, and subsequent drying by filtered nitrogen.

A replication medium was prepared composed of ethyl lactate, SR351, EB350, and IRGACUR TPO in weight ratios of 255/60/40/2. The materials were combined and stirred manually with a glass rod, then allowed to dissolve until the mixture appeared transparent.

Patterned templates were used for nanoimprinting including a silicon containing release layer assembled according to the "method for release treatment" described in WO2020/095258 over a 5-micron thick structured layer composed of PHOTOMER 6210, SR238, SR351, and IRGACUR TPO in weight ratios of 60/20/20/0.5 on a polycarbonate backing film 4 thousandths of an inch in thickness. The pattern of the patterned templates was an array of posts 150 nm in diameter and 450 nm in height.

The substrate was treated with adhesion promoter. The substrate was manually dip coated with a solution of 2-(3-trimethoxysilylpropylcarbamoyloxy)ethyl prop-2-enoate; 3M Company (St. Paul), assembled as described in Example 7 of U.S. Pat. No. 9,790,396 in MEK. The substrate was brought to a temperature of 120 degrees Celsius in a convection oven for 10 minutes. The substrate was transported to a single axis, manually actuated linear stage, aligned to pre-marked fiducials on the linear stage platen, and secured with tape. The replication medium was printed in a sparse rectangular drop pattern on a sub-region of the substrate. The replication medium was printed with a KM1024 MHB (KONICA MINOLTA, Tokyo, Japan) printhead mounted over the linear stage. Printing was synchronized by an ACCU-CODER TR1-U2R4-1000ONV1RHV-K00 wheel tachometer (ENCODER PRODUCT COMPANY, Sagle, Idaho) with microns resolution and 12" circumference configured to track the motion of the linear stage relative to the printhead. The nominal drop volume of the KM1024 MHB printhead is 13 picolitres. The jetting voltage was set to 14V, the jetting waveform was set to DRR format with a 5-microsecond acoustic length, the print temperature was set to 35 degrees Celsius, and the drop spacing was 70.5 microns.

The printed substrate was moved to a hot plate and brought to a temperature of 80 degrees Celsius for minutes to drive off the ethyl lactate in the replication medium. A patterned template was laminated to the printed substrate. The working stamp was laminated manually with a hand roller. One edge of the working stamp was pinned to an adjacent sub-region of the substrate with roller, tension was manually applied to the other edge of the working stamp, and the roller was advanced over the working stamp.

A 385 nm LED UV curing lamp was used to cure the replication medium. The sample was cured through the patterned template at 40V, 8A input for 5 minutes. The substrate was moved back to the linear stage and a new rectangular drop pattern was printed in a sub-region adjacent to the first sub-region and steps 5-8 were repeated 3 times. The 4 patterned templates were manually peeled from the substrate with SCOTCH tape.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of forming an array of patterns on a substrate, the method comprising:
    providing a substrate including a first major surface;
    providing a tiling region on the first major surface of the substrate, wherein the tiling region comprises an array of sub-regions;
    for each sub-region, providing a protective tile to cover the sub-regions, comprising depositing a layer of protectant resin within the sub-region, and solidifying the protectant resin to form an array of the protective tiles corresponding to the array of sub-regions; and
    sequentially repeating steps (i) and (ii) for each sub-region of a plurality of the subregions to form an array of patterns on the plurality of sub-regions of the substrate:
        (i) removing the protective tile from a selected one of the plurality of sub-regions to expose the first major surface underneath; and
        (ii) forming a pattern on the exposed first major surface within the selected one of the sub-regions;
    wherein the step (ii) further comprises:
        (a) providing a replication medium on a relief structure of a patterned template and contacting the replication medium on the relief structure of the patterned template with the selected one of the sub-regions of the substrate; or
        (b) providing a replication medium on the selected one of the sub-regions of the substrate; and contacting the replication medium on the selected one of the sub-regions of the substrate with the relief structure of the patterned template; and removing the patterned template from the selected one of the sub-regions of the substrate.

2. The method of claim 1, further comprising curing the replication medium before removing the patterned template from the sub-region.

3. The method of claim 1, further comprising cleaning the relief structure of the patterned template before contacting the replication medium with the relief structure.

4. The method of claim 3, wherein cleaning the relief structure of the patterned template further comprises peeling a layer of polymer resin from the relief structure.

5. The method of claim 1, wherein the replication medium comprises radiation curing acrylate.

6. The method of claim 1, further comprising applying an overcoat on a master tool, curing the overcoat, and separating the cured overcoat from the master tool to form the relief structure of the patterned template.

7. The method of claim 6, wherein the overcoat comprises a UV-curable resin including at least one of acrylate monomers, acrylate oligomers, silicone, or silicone acrylate.

8. The method of claim 1, wherein the relief structure of the patterned template comprises a structured surface comprising an arrangement of pattern elements extending away from a base surface thereof, the pattern elements having an average lateral dimension in a range from about 1 nm to 1000 micrometers, and an aspect ratio of height to the lateral dimension in a range from about 0 to 20.

9. The method of claim 1, wherein the sub-region is substantially free of ultra-fine particles having a diameter of at least about 0.1 micrometers and larger particles after removing the protective tile.

10. The method of claim 1, wherein the step (ii) further comprises providing a pattern protectant resin on the pattern within the sub-region.

11. The method of claim 1, wherein each tile of the array of patterns has a rectangular shape.

12. The method of claim 1, wherein the array of sub-regions comprises 2 to 10000 sub-regions regularly or irregularly arranged on the first major surface of the substrate.

13. The method of claim 1, wherein the array of sub-regions within the tiling region comprises a rectilinear array of sub-regions.

14. The method of claim 1, wherein the substrate comprises at least one of a flexible polymer, a rigid polymer, glass, quartz, a silicon wafer, or a polished metal.

15. The method of claim 1 wherein providing a protective tile to cover each of the sub-regions further comprises laminating a secondary carrier film for the protective tiles.

16. The method of claim 1, wherein the step (ii) further comprises:

providing an ink on the relief structure of a patterned template, the ink comprising a functionalizing molecule with a functional group selected to chemically bind to the first major surface within the sub-region; and contacting the patterned template with the first major surface within the sub-region to form a self-assembled monolayer (SAM) of the functionalizing material on the first major surface within the sub-region and impart the arrangement of pattern elements thereto.

17. The method of claim 1, wherein the first major surface of the substrate comprises an adhesion promoter layer.

18. The method of claim 1, wherein the patterned template comprises a release layer.

19. The method of claim 1, wherein the patterned template comprises a flexible film.

* * * * *